(12) United States Patent
Takimoto et al.

(10) Patent No.: US 8,247,847 B2
(45) Date of Patent: Aug. 21, 2012

(54) SOLID-STATE IMAGING DEVICE AND MANUFACTURING METHOD THEREFOR

(75) Inventors: Kaori Takimoto, Kanagawa (JP); Masayuki Okada, Kumamoto (JP); Takeshi Takeda, Kumamoto (JP)

(73) Assignee: Sony Corporation, Tokyo (JP)

( * ) Notice: Subject to any disclaimer, the term of this patent is extended or adjusted under 35 U.S.C. 154(b) by 37 days.

(21) Appl. No.: 12/612,466

(22) Filed: Nov. 4, 2009

(65) Prior Publication Data

US 2010/0140667 A1     Jun. 10, 2010

(30) Foreign Application Priority Data

Dec. 9, 2008   (JP) ................. 2008-312847

(51) Int. Cl.
*H01L 27/148*     (2006.01)
*H01L 29/66*     (2006.01)

(52) U.S. Cl. ........ 257/215; 257/217; 257/222; 257/223; 257/242; 257/248; 257/E27.153; 257/E27.154; 257/E27.16; 257/E21.185; 257/E21.189; 257/E21.456; 257/E21.617; 257/E29.227; 257/E29.228

(58) Field of Classification Search ............ 257/217, 257/222, 223, E21.185, E21.189, E21.456, 257/E21.617, 215, E27.153, E27.154, E27.16, 257/E29.227, E29.228, 242, 248
See application file for complete search history.

(56) References Cited

U.S. PATENT DOCUMENTS

| 6,717,190 B2 * | 4/2004 | Shizukuishi | 257/232 |
| 2008/0213936 A1 * | 9/2008 | Hatai | 438/60 |

FOREIGN PATENT DOCUMENTS

| JP | 2003-78126 | 3/2003 |
| JP | 2003-078126 | 3/2003 |
| JP | 2005-032756 | 2/2005 |
| JP | 2006-216655 | 8/2006 |
| JP | 2006-287059 | 10/2006 |
| JP | 03-246971 | 1/2007 |
| JP | 2007-012677 | 1/2007 |
| JP | 2007-12677 | 1/2007 |
| JP | 2010-098113 | * 4/2010 |

* cited by examiner

*Primary Examiner* — Long Tran
(74) *Attorney, Agent, or Firm* — Robert J. Depke; Rockey, Depke & Lyons, LLC

(57) ABSTRACT

A solid-state imaging device including a first transfer electrode portion and a second transfer electrode portion having a pattern area ratio higher than that of the first transfer electrode portion. The first transfer electrode portion includes a plurality of first transfer electrodes having a single-layer structure of metal material. The second transfer electrode portion includes a plurality of second transfer electrodes having a single-layer structure of polycrystalline silicon or amorphous silicon.

3 Claims, 6 Drawing Sheets

SOLID-STATE IMAGING DEVICE AND MANUFACTURING METHOD THEREFOR

The present application claims priority to Japanese Patent Application JP 2008-312847 filed in the Japan Patent Office on Dec. 9, 2008, the entire contents of which is hereby incorporated by reference.

BACKGROUND OF THE INVENTION

1. Field of the Invention

The present invention relates to a solid-state imaging device and a manufacturing method therefor, and more particularly to a structure of transfer electrodes and a method of forming the structure.

2. Description of the Related Art

A CCD (Charge Coupled Device) type solid-state imaging device used in an area sensor, digital still camera, etc. includes a plurality of transfer electrodes for transferring signal charges from a photoelectric converting portion. The transfer electrodes are arranged adjacent to each other on a charge transfer line formed in a device substrate and sequentially driven.

In such a CCD type solid-state imaging device, a reduction in resistance of each transfer electrode is required for a large angle of view and a high transfer ratio. In the case that each transfer electrode is formed of a metal material having light shieldability, the resistance of each transfer electrode can be reduced and a photodiode forming area can be increased because each transfer electrode need not be covered with a light shielding film. Accordingly, a larger quantity of light can be detected by the photodiodes and an improvement in sensitivity characteristics can therefore be expected.

Techniques of forming transfer electrodes by using a metal material are described in Japanese Patent Laid-open Nos. 2003-78126 and 2007-12677, for example. According to the technique described in Japanese Patent Laid-open No. 2007-12677, polycrystalline silicon electrodes are first formed as dummy electrodes, and the dummy electrodes are next removed to form recesses. Thereafter, a metal film is formed so as to fill these recesses with a metal material, and an excess part of the metal material is next removed by CMP (Chemical Mechanical Polishing) to thereby form the transfer electrodes from the metal material.

SUMMARY OF THE INVENTION

It is generally known that the degree of dishing or erosion (the amount of depression of a pattern) in CMP is different according to a pattern area ratio. The pattern area ratio is the ratio of the area of an electrode pattern to a unit area. Accordingly, in a transfer electrode portion including transfer electrodes whose pattern area ratio is relatively high, the pattern density of the transfer electrodes is also relatively high, whereas in a transfer electrode portion including transfer electrodes whose pattern area ratio is relatively low, the pattern density of the transfer electrodes is also relatively low.

In a CCD type solid-state imaging device, the width of a separating portion determining the width of an electrode gap between the transfer electrodes is an important factor in determining a transfer efficiency. It is known that narrowing the electrode gap of the transfer electrodes is desirable for an increase in transfer efficiency. The CCD type solid-state imaging device has a vertical transfer electrode portion for vertically transferring signal charges and a horizontal transfer electrode portion for horizontally transferring signal charges. The pattern area ratio of the horizontal transfer electrode portion is higher than that of the vertical transfer electrode portion in an imaging area.

In the case of forming the transfer electrodes from a metal material both in the vertical transfer electrode portion and in the horizontal transfer electrode portion by using CMP, there arises a difference in the degree of dishing or erosion due to the difference in pattern area ratio between the vertical transfer electrode portion and the horizontal transfer electrode portion. More specifically, the degree of dishing or erosion in the horizontal transfer electrode portion having a relatively high pattern area ratio is larger than that in the vertical transfer electrode portion having a relatively low pattern area ratio. Accordingly, if the processing conditions of CMP are set so as to conform to the vertical transfer electrode portion having a relatively low pattern area ratio, there arises a problem that excess depression due to dishing or erosion occurs in the horizontal transfer electrode portion having a relatively high pattern area ratio. Such excess depression of the transfer electrodes may cause a degradation in flatness in the device substrate or the occurrence of color shading in imaging.

It is accordingly desirable to provide a solid-state imaging device having a first transfer electrode portion and a second transfer electrode portion different in pattern area ratio from each other, wherein transfer electrodes can be formed in the first and second transfer electrode portions without the occurrence of excess depression due to dishing or erosion.

It is further desirable to provide a manufacturing method for such a solid-state imaging device.

In accordance with an embodiment of the present invention, there is provided a solid-state imaging device including a first transfer electrode portion; and 4 second transfer electrode portion having a pattern area ratio higher than that of the first transfer electrode portion; the first transfer electrode portion including a plurality of first transfer electrodes having a single-layer structure of metal material; the second transfer electrode portion including a plurality of second transfer electrodes having a single-layer structure of polycrystalline silicon or amorphous silicon.

In the solid-state imaging device according to an embodiment of the present invention, the first transfer electrodes having a single-layer structure of metal material are formed in the first transfer electrode portion having a relatively low pattern area ratio, and the second transfer electrodes having a single-layer structure of polycrystalline silicon or amorphous silicon are formed in the second transfer electrode portion having a relatively high pattern area ratio. Accordingly, in the case of forming the first transfer electrodes by filling a metal material and next performing CMP, the occurrence of excess depression due to dishing or erosion can be prevented.

In accordance with another embodiment of the present invention, there is provided a manufacturing method for a solid-state imaging device including the steps of: forming a plurality of dummy electrodes having a single-layer structure of polycrystalline silicon or amorphous silicon in a first transfer electrode portion and also forming a plurality of second transfer electrodes having a single-layer structure of polycrystalline silicon or amorphous silicon in a second transfer electrode portion having a pattern area ratio higher than that of the first transfer electrode portion; removing the dummy electrodes formed in the first transfer electrode portion; and forming a metal film so as to fill with a metal material a plurality of recesses formed by removing the dummy electrodes, and next removing an excess part of the metal material to thereby form a plurality of first transfer electrodes having a single-layer structure of the metal material in the recesses formed in the first transfer electrode portion.

In the manufacturing method for the solid-state imaging device according to the embodiment of the present invention, the dummy electrodes formed in the first transfer electrode portion are removed to form the recesses, and there recesses are next filled with the metal material. Thereafter, an excess part of the metal material is removed by CMP, for example. In this case, the second transfer electrodes are first formed together with the dummy electrodes, and the dummy electrodes are next removed to leave the second transfer electrodes. Accordingly, in the case of forming the first transfer electrodes by filling a metal material and next performing CMP, the occurrence of excess depression due to dishing or erosion can be prevented.

According to the embodiments of the present invention, it is possible to provide a solid-state imaging device having a first transfer electrode portion and a second transfer electrode portion different in pattern area ratio from each other, wherein transfer electrodes can be formed in the first and second transfer electrode portions without the occurrence of excess depression due to dishing or erosion. As a result, flatness in the device substrate can be improved to thereby suppress the occurrence of color shading in imaging.

Other features of the invention will be more fully understood from the following detailed description and appended claims when taken with the accompanying drawings.

DETAILED DESCRIPTION OF THE PREFERRED EMBODIMENT

A preferred embodiment of the present invention will now be described in detail with reference to the drawings. It should be noted that the technical scope of the present invention is not limited to the following preferred embodiment, but various modifications and changes may be made within such a scope that a specific effect can be derived from the constituent features of the invention or the combination thereof.

Figure 1:
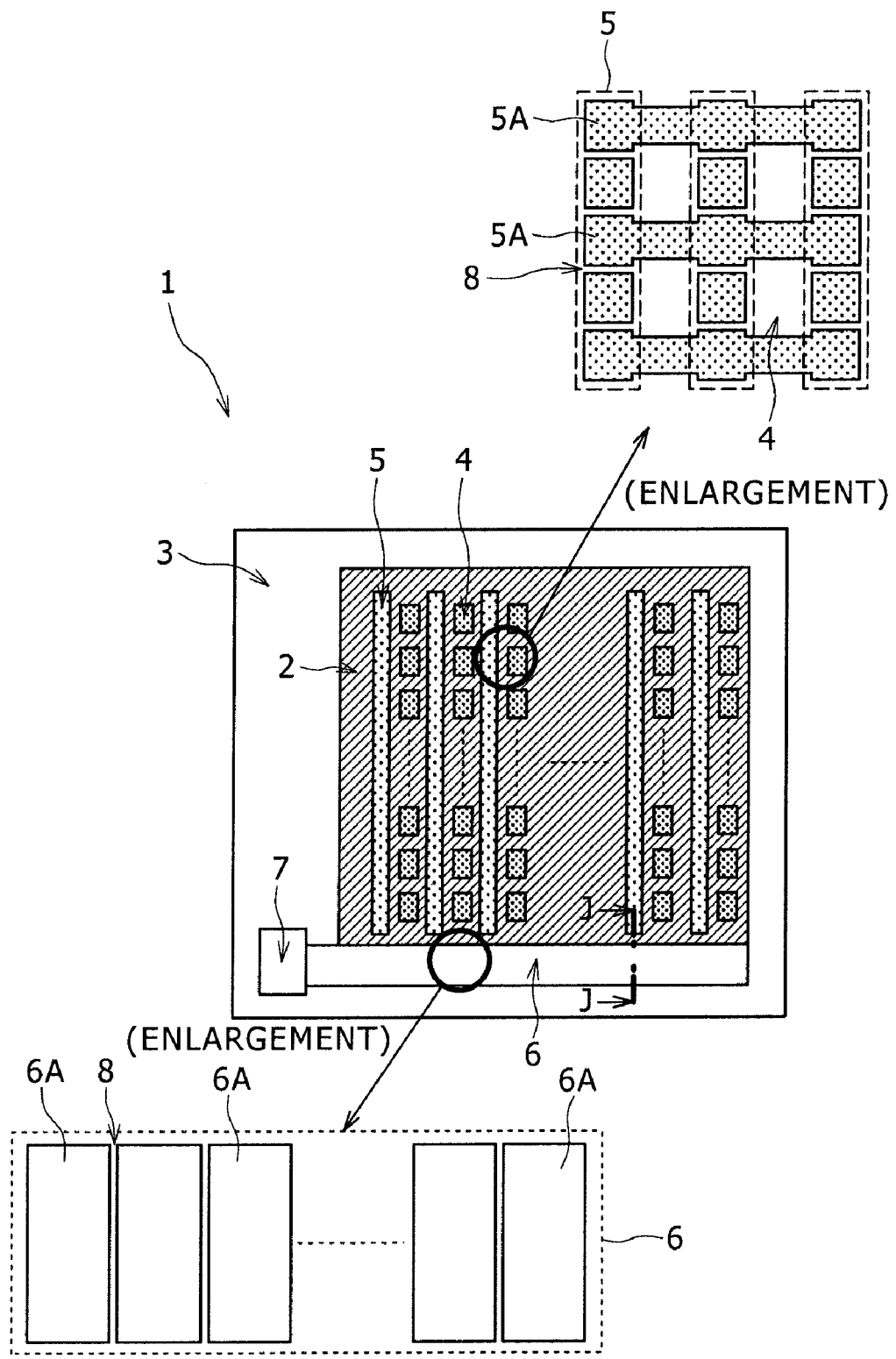
FIG. 1 is a schematic plan view showing the configuration of a CCD type solid-state imaging device according to a preferred embodiment of the present invention.

The preferred embodiment of the present invention will be described in the following order.
1. Configuration of solid-state imaging device
2. Manufacturing method for solid-state imaging device
3. Application 1. Configuration of Solid-State Imaging Device FIG. 1 is a schematic plan view showing the configuration of a CCD type solid-state imaging device 1 according to the preferred embodiment. As shown in FIG. 1, the solid-state imaging device 1 is partitioned into an imaging area 2 and a peripheral area 3. The imaging area 2 is a rectangular area formed in the plane of a device substrate (not shown). The peripheral area 3 is an area surrounding the imaging area 2 in the plane of the device substrate.

The imaging area 2 is provided with a plurality of photodiode portions 4 and a plurality of vertical transfer electrode portions 5. Each photodiode portion 4 has a function (photoelectric converting function) of converting light detected into signal charges according to the quantity of the light detected. These plural photodiode portions 4 are arranged two-dimensionally (in rows and columns) in the imaging area 2. The plural vertical transfer electrode portions 5 are arranged adjacent to the columns of the photodiode portions 4. Each vertical transfer electrode portion 5 functions to vertically transfer the signal charges stored in each photodiode portion 4 and read from this photodiode portion 4. Each vertical transfer electrode portion 5 is composed of a plurality of vertical transfer electrodes 5A as vertical CCD arranged in the vertical direction. In each vertical transfer electrode portion 5, any adjacent ones of the vertical transfer electrodes 5A are spaced from each other to thereby form a separating portion 8 for defining the electrode gap width of the vertical transfer electrodes 5A.

The peripheral area 3 is provided with a horizontal transfer electrode portion 6 and an output portion 7. The horizontal transfer electrode portion 6 functions to receive the signal charges from the plural vertical transfer electrode portions 5 and transfer them in the horizontal direction. The horizontal transfer electrode portion 6 is composed of a plurality of horizontal transfer electrodes 6A as horizontal CCD arranged in the horizontal direction. In the horizontal transfer electrode portion 6, any adjacent ones of the horizontal transfer electrodes 6A are spaced from each other to thereby form a separating portion 8 for defining the electrode gap width of the horizontal transfer electrodes 6A. The output portion 7 functions to convert the signal charges transferred by the horizontal transfer electrode portion 6 into a voltage and output this voltage.

The pattern area ratio of the vertical transfer electrode portion 5 in the imaging area 2 is defined as the ratio of the pattern area of the vertical transfer electrodes 5A to the area of one or more pixels each including the vertical transfer electrode 5A and the photodiode portion 4 as a unit area. That is, the imaging area 2 has a plurality of pixels formed in rows and columns, wherein each pixel is composed of the vertical transfer electrode 5A, the separating portion 8, and the photodiode portion 4. Accordingly, the pattern of the vertical transfer electrode 5A in each pixel is formed by excluding the separating portion 8 and the photodiode portion 4. Letting Sv denote the pattern area of the vertical transfer electrodes 5A, Gv denote the area of the separating portions 8, and Sp denote the area of the photodiode portions 4, the pattern area ratio Pv(%) of the vertical transfer electrode portions 5 in the imaging area 2 is expressed as follows:

$$Pv=[Sv/(Sv+Gv+Sp)]\times 100$$

On the other hand, the pattern area ratio of the horizontal transfer electrode portion 6 is defined as the ratio of the pattern area of the horizontal transfer electrodes 6A to the area of the horizontal transfer electrode portion 6 as a unit area. That is, the horizontal transfer electrode portion 6 is formed by the horizontal repetition of the horizontal transfer electrode 6A and the separating portion 8. Accordingly, the pattern of the horizontal transfer electrodes 6A is formed by excluding the separating portions 8 in the horizontal transfer electrode portion 6. Letting Sh denote the pattern area of the horizontal transfer electrodes 6A and Gh denote the area of the separating portions 8, the pattern area ratio Ph(%) of the horizontal transfer electrode portion 6 is expressed as follows:

$$Ph=[Sh/(Sh+Gh)]\times 100$$

Accordingly, the pattern area ratio of the horizontal transfer electrode portion 6 is higher than the pattern area ratio of the vertical transfer electrode portions 5 in the imaging area 2. Therefore, the vertical transfer electrode portions 5 correspond to "a first transfer electrode portion," and the horizontal transfer electrode portion 6 corresponds to "a second transfer electrode portion." The vertical transfer electrodes 5A constituting the vertical transfer electrode portions 5 and the horizontal transfer electrodes 6A constituting the horizontal transfer electrode portion 6 are formed of different electrode materials. More specifically, the vertical transfer electrodes 5A are formed of metal material, and the horizontal transfer electrodes 6A are formed of polycrystalline silicon. Further, the vertical transfer electrodes 5A have a single-layer structure of metal material, and the horizontal transfer electrodes 6A have a single-layer structure of polycrystalline silicon.

2. Manufacturing Method for Solid-State Imaging Device

The manufacturing method for the solid-state imaging device according to a first preferred embodiment of the present invention will now be described with reference to FIGS. 2A to 4C. FIGS. 2A to 4C show process steps for fabrication of an essential part of the solid-state imaging device (i.e., a sectional structure taken along the line J-J in FIG. 1).

Figure 2A:
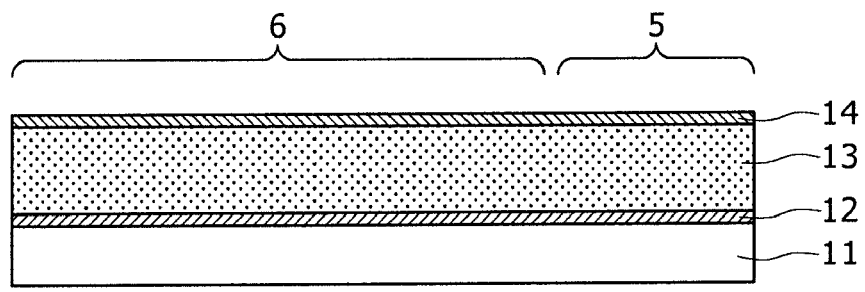
FIGS. 2A to 4C are schematic sectional views for illustrating the manufacturing method for the solid-state imaging device according to a first preferred embodiment of the present invention.

As shown in FIG. 2A, an insulating film 12 of silicon oxide is formed on the upper surface of a device substrate 11 by thermal oxidation. The device substrate 11 is formed from a semiconductor substrate such as a silicon substrate. The insulating film 12 functions as a gate insulating film. Thereafter, a polycrystalline silicon film 13 is formed over the device substrate 11 so as to cover the insulating film 12. The polycrystalline silicon film 13 functions as transfer electrodes and gate electrodes. Thereafter, a hard mask layer 14 is formed over the device substrate 11 so as to cover the polycrystalline silicon film 13. The hard mask layer 14 is formed from an insulating film such as a nitride film.

Figure 2B:
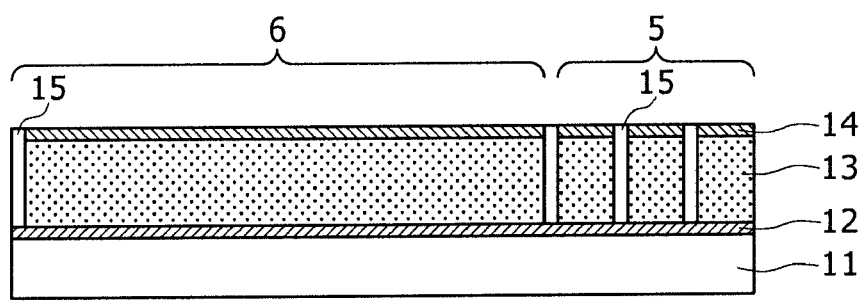

As shown in FIG. 2B, openings are formed through the hard mask layer 14 by etching or the like, and the polycrystalline silicon film 13 is next etched through the openings of the hard mask layer 14 to thereby form trenches 15 at the positions where the separating portions 8 for separating the transfer electrodes are to be formed.

Figure 2C:
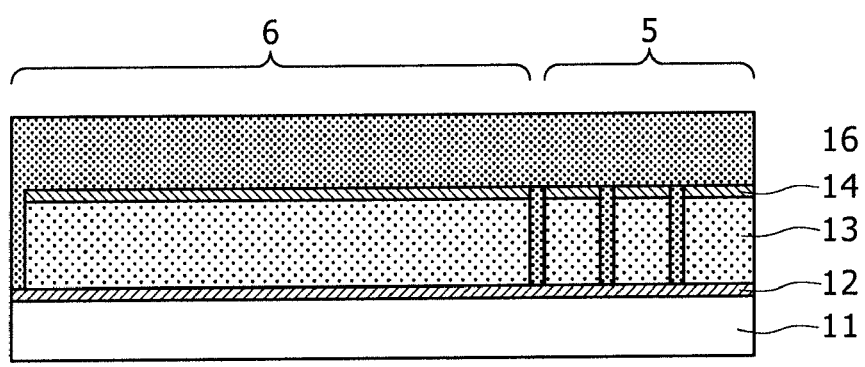

As shown in FIG. 2C, an insulating film 16 is formed on the hard mask layer 14 so as to fill the trenches 15 with an insulating material. The insulating film 16 is an oxide film or a nitride film. The insulating film 16 may be a laminated film having two or more layers.

Figure 2D:
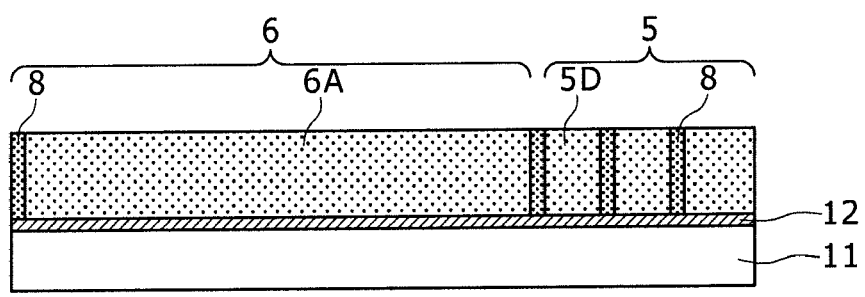

As shown in FIG. 2D, the hard mask layer 14 and an excess part of the insulating film 16 formed on the hard mask layer 14 are removed by CMP. At this time, the uppermost surface of the substrate including the polycrystalline silicon film 13 is planarized by the CMP. In this stage, dummy electrodes 5D having a single-layer structure of polycrystalline silicon are formed in the vertical transfer electrode portions 5, and simultaneously horizontal transfer electrodes 6A having a single-layer structure of polycrystalline silicon are formed in the horizontal transfer electrode portion 6. Further, a separating portion 8 of insulating material is formed between any adjacent ones of the dummy electrodes 5D and between any adjacent ones of the horizontal transfer electrodes 6A. Alternatively, in the imaging area 2, a part of the polycrystalline silicon film 13 covering the region for forming the photodiode portions 4 may be removed and an impurity may be next introduced into this region by ion implantation. Thereafter, an insulating film such as an oxide film may be deposited to the steps of the photodiode portions 4.

Figure 3A:
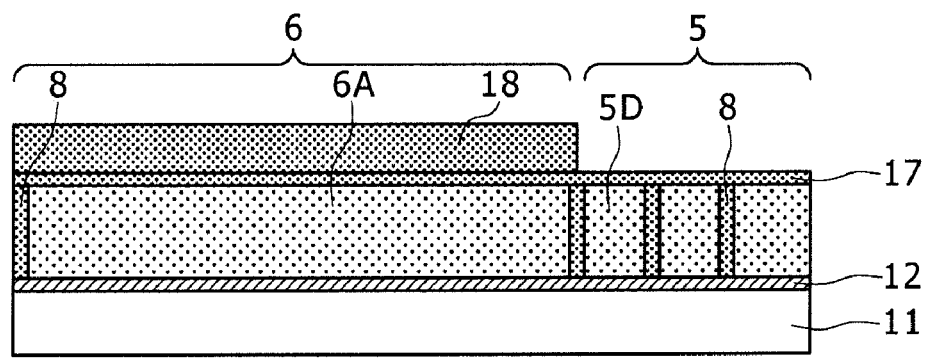

As shown in FIG. 3A, an insulating film 17 is formed so as to cover the vertical transfer electrode portions 5 and the horizontal transfer electrode portion 6, and a resist film 18 is next formed so as to cover the horizontal transfer electrode portion 6. More specifically, the resist film 18 is first formed in the whole area of the substrate, i.e., both in the imaging area 2 including the vertical transfer electrode portions 5 and in the peripheral area 3 including the horizontal transfer electrode portion 6. Thereafter, the resist film 18 is patterned by photolithography so as to form an opening through the resist film 18 in the imaging area 2.

Figure 3B:
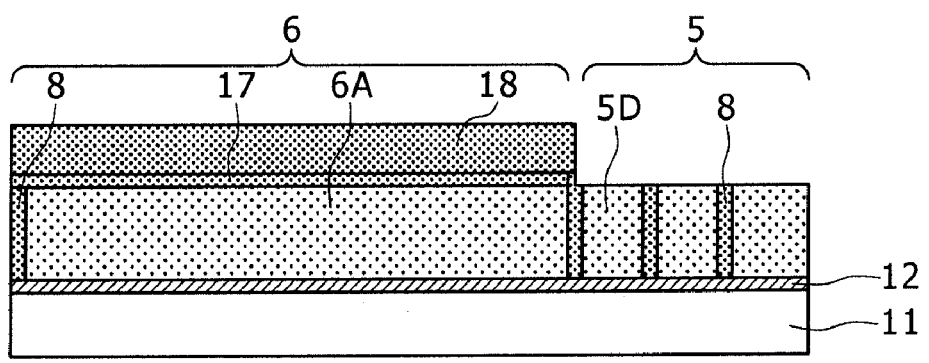

As shown in FIG. 3B, the insulating film 17 covering the vertical transfer electrode portions 5 is removed by dry etching, for example, using the resist film 18 as an etching mask. Accordingly, the upper surface of each dummy electrode 5D formed of polycrystalline silicon is exposed.

Figure 3C:
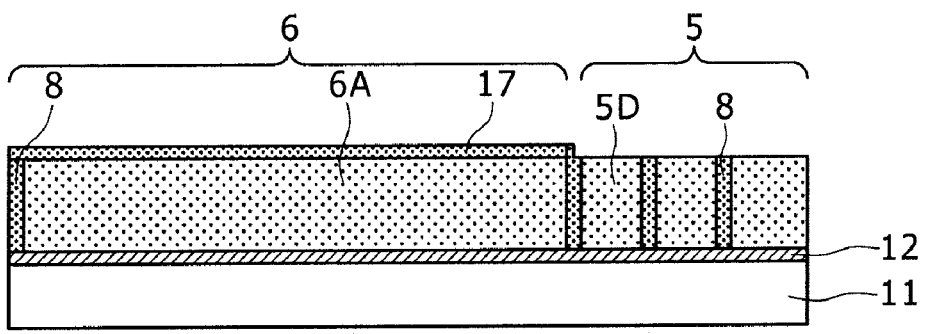

As shown in FIG. 3C, the resist film 18 is removed to expose the insulating film 17.

Figure 4A:
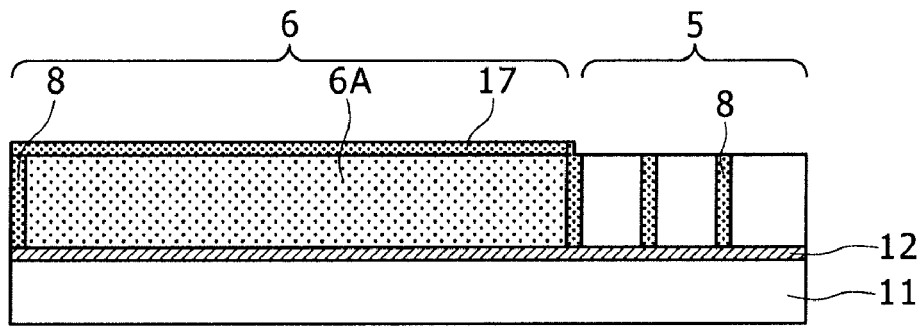

As shown in FIG. 4A, the dummy electrodes 5A exposed by the previous step are removed by etching (dry etching or wet etching). At this time, the insulating film 17 covering the horizontal transfer electrodes 6A functions as an etching protective layer. Accordingly, the horizontal transfer electrodes 6A are not etched. Thus, the dummy electrodes 5D in the vertical transfer electrode portions 5 are removed to form recesses corresponding to the dummy electrodes 5D, so that the insulating film 12 is exposed to the bottom of each recess.

Figure 4B:
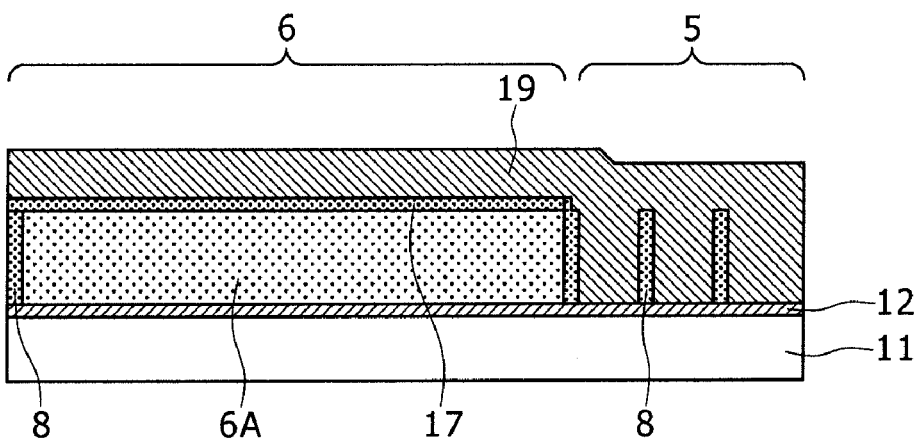

As shown in FIG. 4B, a metal film 19 is formed so as to cover the vertical transfer electrode portions 5 and the horizontal transfer electrode portion 6. The metal film 19 is formed so as to fill the recesses in the vertical transfer electrode portions 5 by depositing tungsten by sputtering and next depositing tungsten by CVD, for example. The metal material used for the deposition of the metal film 19 preferably has low electrical resistance and high optical shieldability. This metal material is not limited to tungsten, but may include other metals such as aluminum, ruthenium, iridium, cobalt, nickel, chromium, titanium, tantalum, hafnium, manganese, molybdenum, silver, tin, vanadium, platinum, gold, and copper, nitrides, compounds, silicides, and alloys of these metals. Further, the metal film 19 may have a laminated structure composed of two or more kinds of metals. In this preferred embodiment, the photodiode portions 4 are formed prior to forming the metal film 19, so that metal contamination of the photodiode portions 4 and its resultant deterioration in pixel characteristics can be suppressed.

Figure 4C:
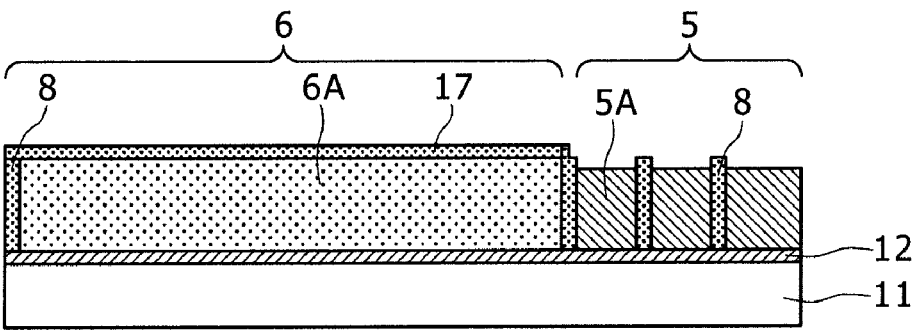

As shown in FIG. 4C, an excess part of the metal film 19 is removed by CMP, for example. At this time, the horizontal transfer electrodes 6A formed of polycrystalline silicon in the horizontal transfer electrode portion 6 are protected by the insulating film 17 (i.e., the insulating film 17 functions as a protective film for the horizontal transfer electrodes 6A in performing the CMP), and the metal material covering the insulating film 17 is removed by polishing. As a result, in the horizontal transfer electrode portion 6, the horizontal transfer electrodes 6A formed of polycrystalline silicon are left. On the other hand, in the vertical transfer electrode portions 5, an excess part of the metal material is removed according to the height (thickness) of the horizontal transfer electrodes 6A, and the upper surface of the metal material filling each recess is planarized. As a result, vertical transfer electrodes 5A formed of the metal material filling the recesses are obtained in the vertical transfer electrode portions 5 so as to have a single-layer structure.

Thereafter, although not shown, an interlayer film, wiring layer, light shielding film, condenser lens, color filter layer, on-chip lens, etc. are formed as in a usual process. In the case that the vertical transfer electrodes 5A are formed of a metal material having light shieldability (e.g., tungsten), it is unnecessary to cover the vertical transfer electrodes 5A with a light shielding film. Accordingly, as compared with the case of covering the vertical transfer electrodes 5A with a light shielding film, the opening area of the photodiode portions 4 can be increased, so that the sensitivity characteristics of the solid-state imaging device 1 can be improved. In the case that the vertical transfer electrodes 5A are covered with a light shielding film, the opening area of the photodiode portions 4 is reduced by the presence of the light shielding film, causing a reduction in sensitivity.

In the manufacturing method according to this preferred embodiment, the horizontal transfer electrodes 6A having a single-layer structure of polycrystalline silicon are first formed in the horizontal transfer electrode portion 6. Thereafter, the dummy electrodes 5D formed in the vertical transfer electrode portions 5 are removed and the vertical transfer electrodes 5A having a single-layer structure of metal material are next formed in the vertical transfer electrode portions 5. Accordingly, although the pattern area ratio of the vertical transfer electrode portions 5 is different from that of the horizontal transfer electrode portion 6, the occurrence of excess depression due to dishing or erosion can be prevented. As a result, flatness in the device substrate can be improved to thereby suppress the occurrence of color shading in imaging. Further, since the pattern density of the vertical transfer electrode portions 5 formed of metal material is constant, optimum CMP conditions can be set in the vertical transfer electrode portions 5. If both of the vertical transfer electrode portions 5 and the horizontal transfer electrode portion 6 are formed of metal material, it is difficult to prevent the occurrence of dishing or erosion because of a large difference in pattern density between the electrode portions 5 and 6.

The manufacturing method for the solid-state imaging device according to a second preferred embodiment of the present invention will now be described mainly with reference to FIGS. 5A to 6C. First, the steps shown in FIGS. 2A to 2D are performed to form the dummy electrodes 5D in the vertical transfer electrode portions 5 and also form the horizontal transfer electrodes 6A in the horizontal transfer electrode portion 6. Further, the separating portions 8 of insulating material are formed so as to separate the dummy electrodes 5A and the horizontal transfer electrodes 6A.

Figure 5A:
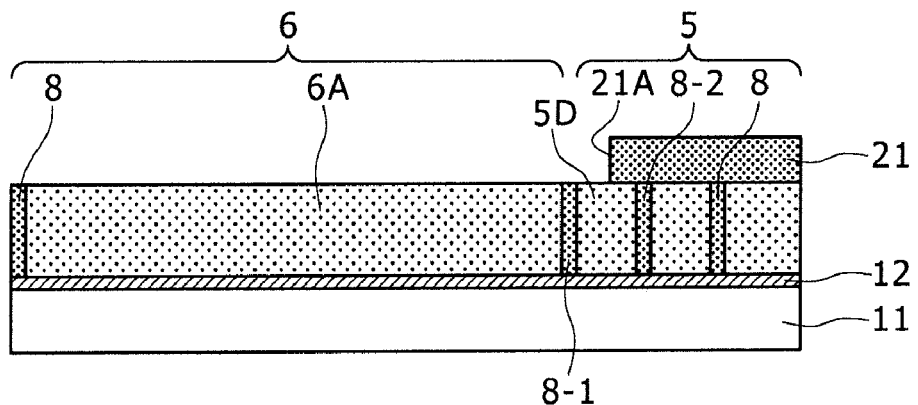
FIGS. 5A to 6C are schematic sectional views for illustrating the manufacturing method for the solid-state imaging device according to a second preferred embodiment of the present invention.

As shown in FIG. 5A, a resist film 21 is formed so as to cover the vertical transfer electrode portions 5. More specifically, the resist film 21 is first formed in the whole area of the device substrate, i.e., both in the imaging area 2 including the vertical transfer electrode portions 5 and in the peripheral area 3 including the horizontal transfer electrode portion 6. Thereafter, the resist film 21 is patterned by photolithography so as to form an opening through the resist film 21 in the horizontal transfer electrode portion 6. Accordingly, the remaining area of the device substrate (including the imaging area 2) except the horizontal transfer electrode portion 6 is covered with the resist film 21. Further, one end 21A of the resist film 21 in the vertical direction is located in an area corresponding to the dummy electrodes 5D arranged in the last row of the vertical transfer electrode portions 5 (i.e., at the position nearest to the horizontal transfer electrode portion 6). More specifically, the dummy electrode 5D arranged in the last row of each vertical transfer electrode 5 is defined between a separating portion 8-1 located at the boundary between this vertical transfer electrode portion 5 and the horizontal transfer electrode portion 6 and a separating portion 8-2 located adjacent to this separating portion 8-1 in the vertical direction. The one end 21A of the resist film 21 is located between these two separating portions 8-1 and 8-2 (preferably, at the middle position therebetween). Accordingly, the dummy electrode 5D arranged in the last row of each vertical transfer electrode portion 5 is partially exposed, that is, partially uncovered with the resist film 21.

Figure 5B:
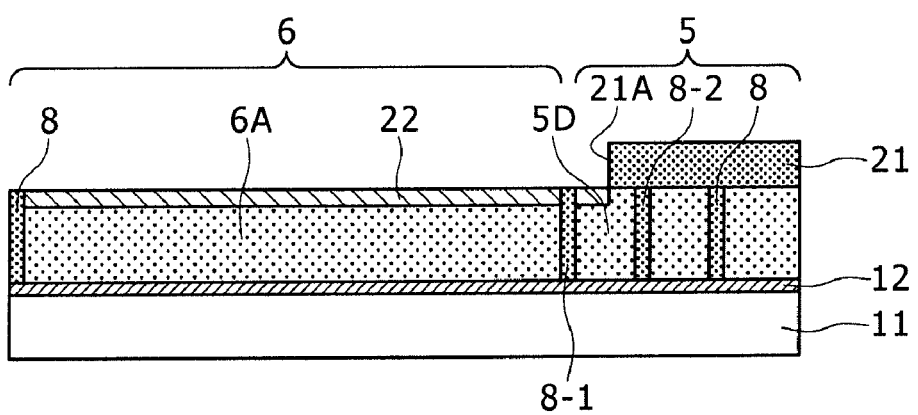

As shown in FIG. 5B, an impurity layer 22 is formed in the surface of each horizontal transfer electrode 6A formed of polycrystalline silicon and in a part of the surface of each dummy electrode 5D in the last row. The impurity layer 22 is formed by implanting an impurity such as boron (B) or boron difluoride (BF2) into the polycrystalline silicon by ion implantation using the resist film 21 covering each vertical transfer electrode portion 5 except each dummy electrode 5D in the last row as a mask.

Figure 5C:
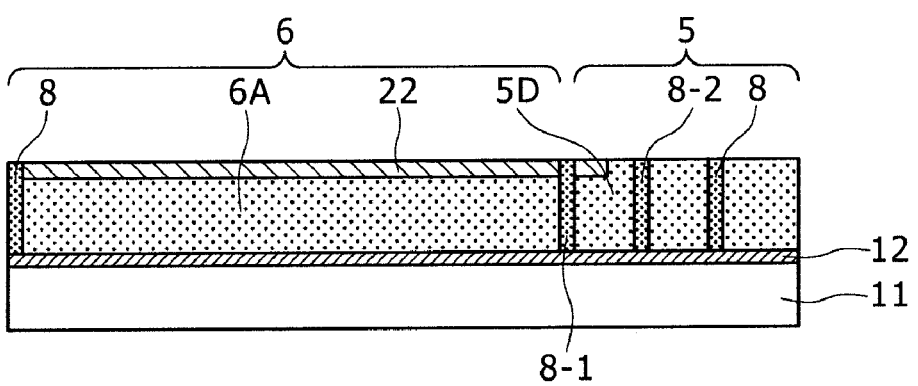

As shown in FIG. 5C, the resist film 21 is removed from the vertical transfer electrode portions 5. As a result, the upper surfaces of all the dummy electrodes 5D in the vertical transfer electrode portions 5 are exposed.

Figure 6A:
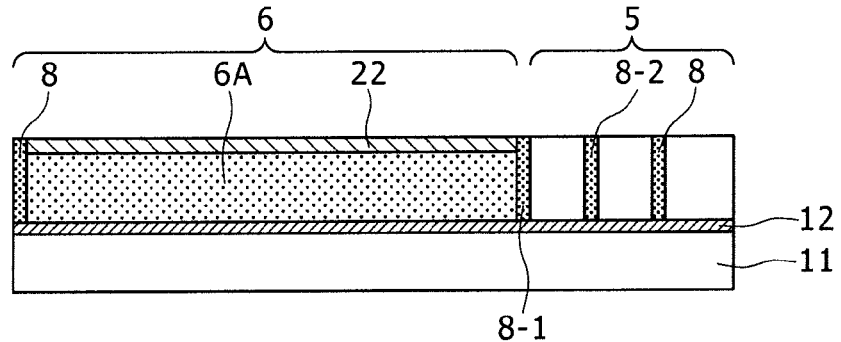

As shown in FIG. 6A, all the dummy electrodes 5D in the vertical transfer electrode portions 5 are removed by wet etching, for example. At this time, aqueous ammonia may be used as an etchant, wherein the impurity layer 22 functions as an etching stopper layer. Accordingly, the dummy electrodes 5D not covered with the impurity layer 22 can be selectively etched off. This point is also shown in a document (Sensors and Actuators A 49 (1995) 115-121). This process step can be similarly performed by wet etching using an alkaline etchant such as TMAH (Tetra Methyl Ammonium Hydride) or KOH (potassium hydroxide).

In the stage shown in FIG. 5C, a part of the dummy electrode 5D in the last row of each vertical transfer electrode portion 5 is covered with the impurity layer 22, and the remaining part of this dummy electrode 5D is exposed. Accordingly, the wet etching starts from this exposed part of the dummy electrode 5D in the last row, so that the dummy electrode 5D in the last row and the other dummy electrodes 5D in the previous rows can be removed by this wet etching. Thus, all of the dummy electrodes 5D can be removed by this wet etching in the condition where the horizontal transfer electrodes 6A having a single-layer structure of polycrystalline silicon are left in the horizontal transfer electrode portion 6.

Figure 6B:
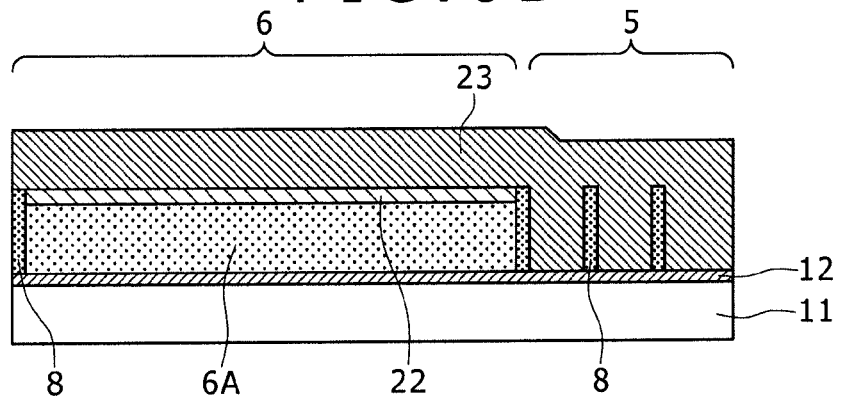

As shown in FIG. 6B, a metal film 23 is formed so as to cover the vertical transfer electrode portions 5 and the horizontal transfer electrode portion 6.

Figure 6C:
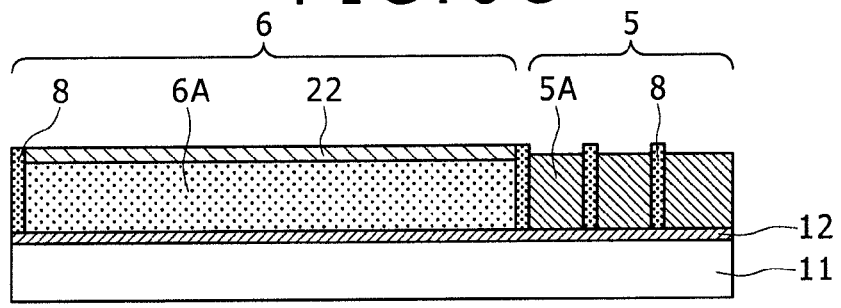

As shown in FIG. 6C, an excess part of the metal film 23 is removed by CMP, for example. At this time, the horizontal transfer electrodes 6A formed of polycrystalline silicon in the horizontal transfer electrode portion 6 are left because of the presence of the impurity layer 22. However, the polycrystalline silicon forming the horizontal transfer electrodes 6A may be slightly removed by CMP. On the other hand, in the vertical transfer electrode portions 5, an excess part of the metal material is removed according to the height (thickness) of the horizontal transfer electrodes 6A, and the upper surface of the metal material filling each recess is planarized. As a result, vertical transfer electrodes 5A formed of the metal material filling the recesses are obtained so as to have a single-layer structure. The subsequent steps are similar to those in the first preferred embodiment, so the description thereof will be omitted herein.

In the manufacturing method according to the second preferred embodiment, the occurrence of excess depression due to dishing or erosion can be prevented both in the vertical transfer electrode portions 5 and in the horizontal transfer electrode portion 6 as in the first preferred embodiment. Further, in the step of covering the dummy electrodes 5D in the vertical transfer electrode portions 5 with the resist film 21, the position of the one end 21A of the resist film 21 may be varied within the width of the dummy electrode 5D in the last row of each vertical transfer electrode portion 5. Also in this case, the dummy electrode 5D in the last row of each vertical transfer electrode portion 5 can be removed in the subsequent wet etching step. Accordingly, an allowable margin for alignment in the photolithography can be made larger than the width of each separating portion 8 (i.e., the electrode gap width), thereby supporting a reduction in electrode gap for the purposes of the improvement in transfer efficiency or the like.

While polycrystalline silicon is used as the electrode material for the dummy electrodes 5D and the horizontal transfer electrodes 6A in the above preferred embodiments, amorphous silicon may be used in place of polycrystalline silicon.

3. Application

Figure 7:
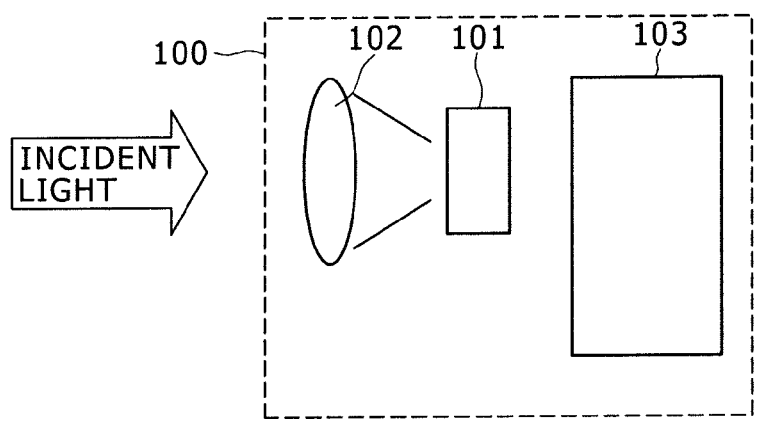
FIG. 7 is a block diagram showing the configuration of an imaging apparatus to which an embodiment of the present invention is applied.

FIG. 7 is a block diagram showing the configuration of an imaging apparatus 100 to which an embodiment of the present invention is applied. The imaging apparatus 100 includes a solid-state imaging unit 101, an optical system (a group of lenses) 102 for introducing light from a subject to the solid-state imaging unit 101, and a signal processing unit 103 for processing a pixel signal output from the solid-state imaging unit 101. The solid-state imaging unit 101 includes the solid-state imaging device 1 according to an embodiment of the present invention. The solid-state imaging unit 101 may be formed as a single chip or may be formed as a module having an imaging function obtained by packaging the solid-state imaging unit 101 together with the signal processing unit 103 or the optical system 102.

The present application contains subject matter related to that disclosed in Japanese Priority Patent Application JP 2008-312847 filed in the Japan Patent Office on Dec. 9, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A Solid-state imaging device comprising:
    a first transfer electrode portion; and a second transfer electrode portion having a pattern area ratio higher than that of said first transfer electrode portion;
        wherein pattern area ratio is the ratio of the area of an electrode pattern to a unit area;
        said first transfer electrode portion including a plurality of first transfer electrodes having a single-layer structure of metal material,
        said second transfer electrode portion including a plurality of second transfer electrodes having a single-layer structure of polycrystalline silicon or amorphous silicon.

2. The solid-state imaging device according to claim 1, wherein said first transfer electrode portion includes a vertical transfer electrode portion for transferring signal charges in a vertical direction; and said second transfer electrode portion includes a horizontal transfer electrode portion for transferring signal charges in a horizontal direction.

3. The solid-state imaging device according to claim 1, wherein said metal material has light shieldability.

* * * * *